United States Patent [19]

Schwartz et al.

[11] 4,068,164
[45] Jan. 10, 1978

[54] HARMOIC FLUX GATE MAGNETOMETERS AND GRADIMETERS AND WINDINGS

[75] Inventors: Malcolm M. Schwartz; James R. Jaquet, both of Wilmington, Del.

[73] Assignee: Infinetics, Inc., Wilmington, Del.

[21] Appl. No.: 5,751

[22] Filed: Jan. 26, 1970

[51] Int. Cl.² .......................................... G01R 33/04
[52] U.S. Cl. ............................... 324/226; 340/258 C; 324/243; 324/253; 273/84 R
[58] Field of Search ................ 324/41, 43, 3; 273/84; 340/197, 38 L, 258, 282

[56] References Cited

U.S. PATENT DOCUMENTS

| | | | |
|---|---|---|---|
| 1,842,471 | 1/1932 | Eliasoff | 324/67 |
| 2,129,058 | 9/1938 | Hedden | 324/41 |
| 2,794,166 | 5/1957 | Ferdon et al. | 324/41 |
| 2,966,853 | 1/1961 | Gilfillan, Jr. et al. | 324/43 X |
| 3,050,679 | 8/1967 | Schonstedt | 324/43 R |
| 3,249,915 | 5/1966 | Koerner | 340/38 L |
| 3,281,660 | 10/1966 | Studenick | 324/34 R |
| 3,292,080 | 12/1966 | Trikilis | 324/41 |
| 3,319,161 | 5/1967 | Beynon | 324/47 |
| 3,434,047 | 3/1969 | Brickner | 324/43 |
| 3,487,459 | 12/1969 | Schonstedt | 324/43 R |
| 3,528,402 | 9/1970 | Abramowitz | 128/2 |

OTHER PUBLICATIONS

Geyger, W., The Ring Core Magnetometer-A New Type of Second Harmonic Flux Gate Magnetometer, A.I.E.E. Transactions, Mar. 1962, pp. 65-73.
Geyger, W., FluxGate Magnetometer uses Toroidal Core, Electronics, June, 1962, pp. 48-52.

*Primary Examiner*—Robert J. Corcoran
*Attorney, Agent, or Firm*—Seidel, Gonda & Goldhammer

[57] ABSTRACT

An improved ring core second harmonic flux gate magnetometer is constructed as a module for use as a ferrous metal detector. Pairs of modules may also be used as gradiometers. Various uses and winding arrangements on the ring cores are disclosed.

9 Claims, 12 Drawing Figures

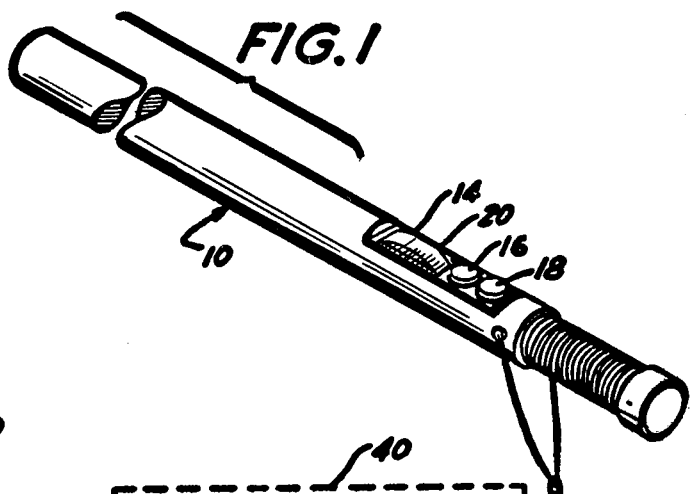
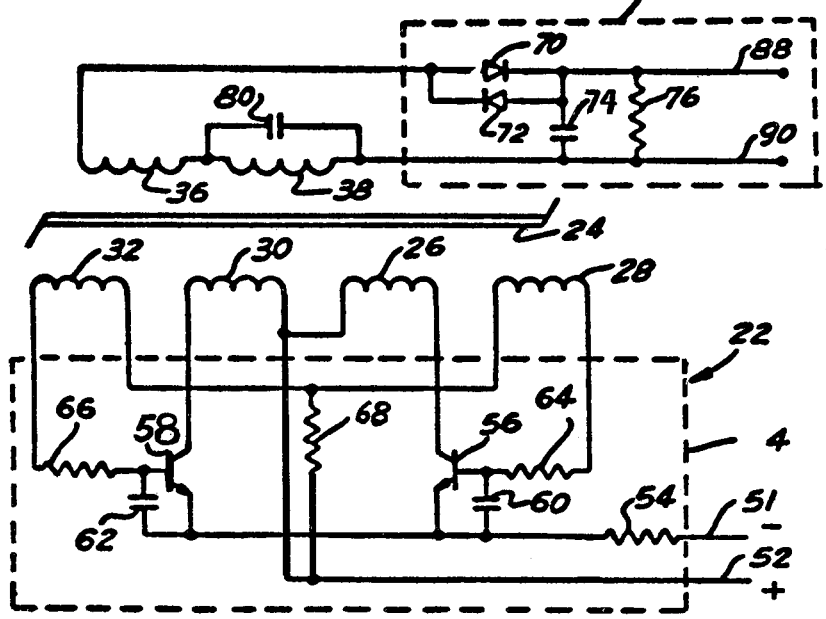
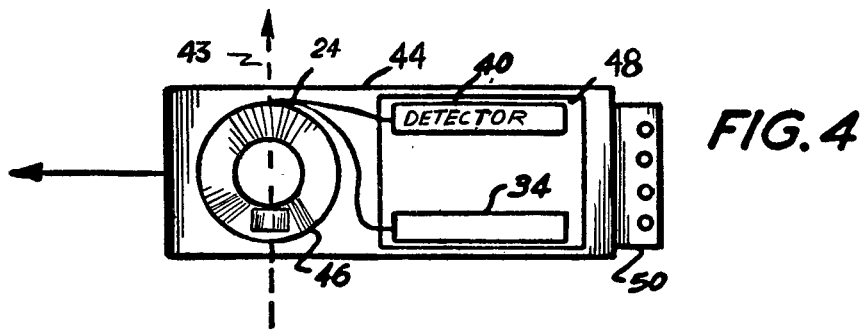

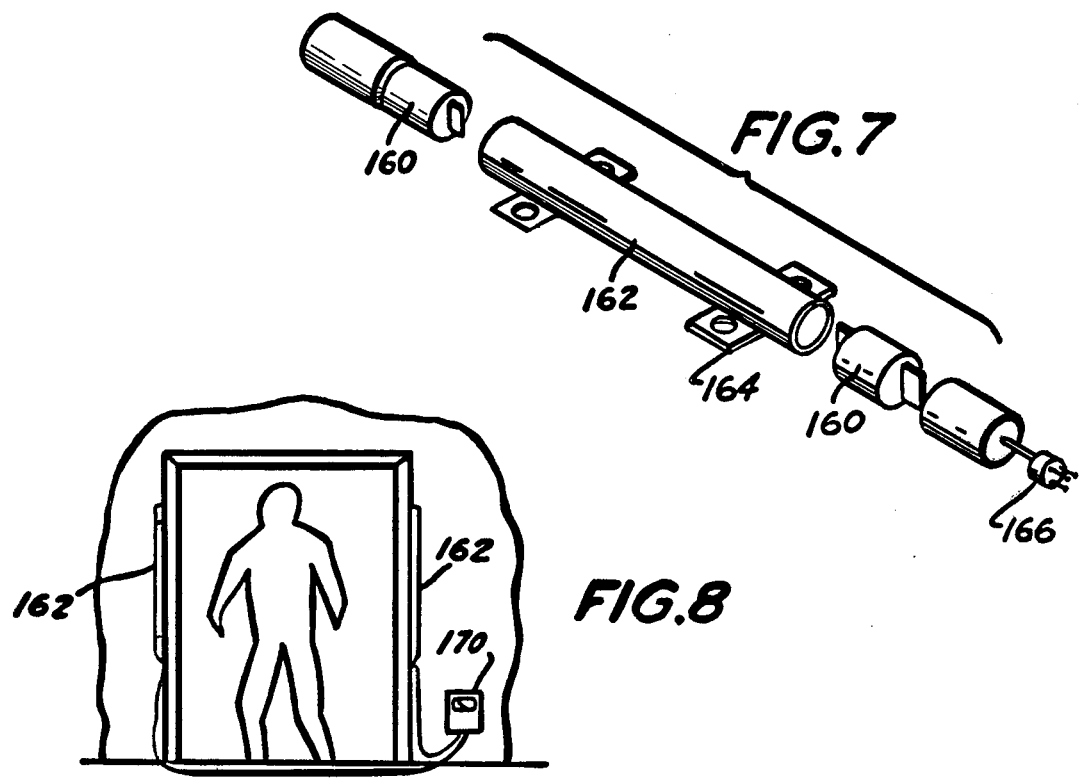
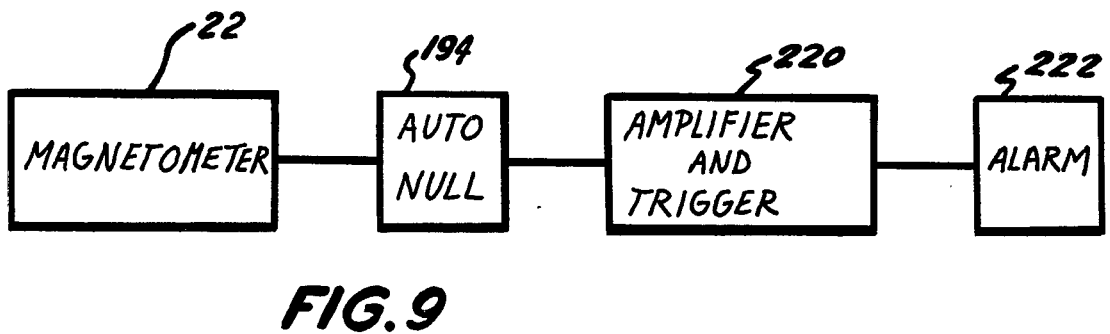

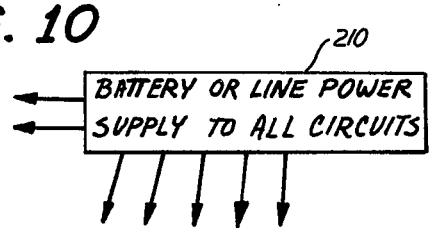
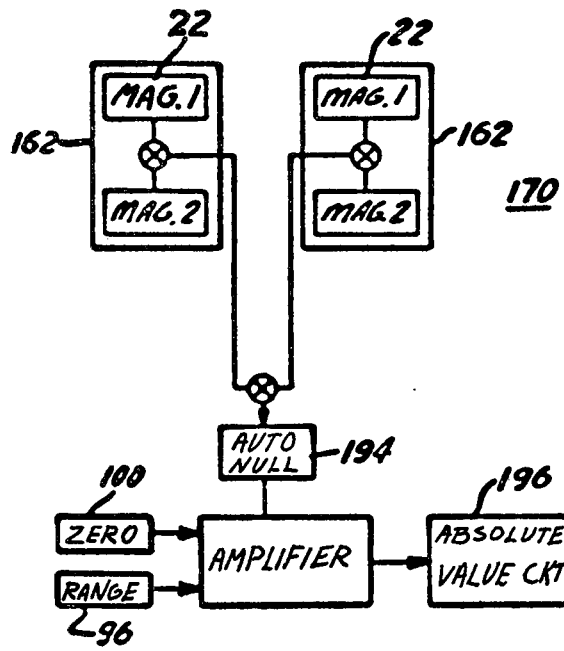
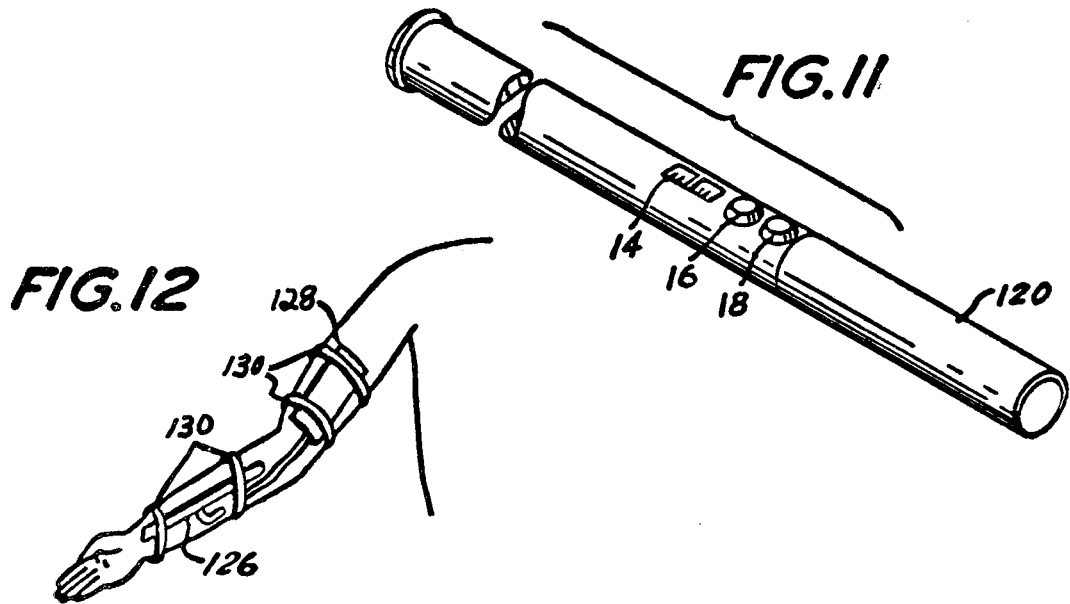

HARMOIC FLUX GATE MAGNETOMETERS AND GRADIMETERS AND WINDINGS

This invention relates to improved second harmonic flux gate magnetometers and gradiometers. More particularly, this invention relates to improvements in flux gate magnetometers which make magnetic detection possible in a number of new uses.

Magnetometers are primarily instruments for measuring the intensity of a magnetic field. The classical magnetometer was devised by K. F. Gauss in 1832 for measuring the intensity of the horizontal component of the earth's magnetic field. Since then there have been improvements in magnetometers. However, the magnetometer to this day remains primarily as a laboratory curiosity or an extremely expensive scientific instrument. High quality, low priced magnetometers are not available on the market. This is despite the fact that such a magnetometer could open up entire new fields of uses for magnetic devices. The present invention is directed to such a magnetometer.

The present invention is particularly directed to a saturable core magnetometer. Such magnetometers have a sensing element made of a material which becomes magnetically saturated in relatively low magnetic fields. A coil surrounding the core excites it into saturation at frequencies ranging from approximately 50 Hz to 500 KHz. If there is no external applied magnetic field, the alternating magnetic flux induced in the halves of the core are the same; but an external steady magnetic field along the axis of the core halves causes one side to saturate relatively sooner than the other side of the core. A second harmonic of the fundamental driving frequency appears across detector windings which are connected in opposition with respect to the fundamental frequency. Both phase and magnitude of the second harmonic voltage are directly proportional to the magnitude and direction of the external field.

The saturable core type of magnetometer is itself not new. It was developed during World War II as an airborne detector of submarines. It is currently used by both government and private industry for geophysical prospecting survey. However, such saturable core magnetometers as are presently in use are extremely cumbersome and hence not readily usable on a lower commercial level in the same manner that a thermometer or voltmeter is useful in their respective fields.

The present invention is directed to a ring core flux gate magnetometer which, as indicated by its title, uses an annular core rather than open-ended linear cores. A ring core magnetometer of the type used herein is disclosed in U.S. Pat. No. 3,403,329 issued Sept. 24, 1968 to William A. Geyger. As shown in that patent, the magnetometer includes a core of saturable high-permeability material. Wound upon the core are a pair of center tapped windings connected in series-aiding relation to a high frequency multivibrator. A pair of detector windings are also wound on the core and are connected in series flux subtracting relationship to a detector. The output of the detector is connected to an amplifier which in U.S. Pat. No. 3,403,329 takes the form of a magnetic amplifier. When subjected to an external magnetic field, the detector windings generate a voltage of the second harmonic which is detected by the detector in a manner to produce an output direct current voltage proportional to the magnitude and direction of the external magnetic field. This direct current voltage is amplified and applied to an appropriate indicator such as a center-zero-scale voltmeter.

The present invention is an improvement upon the ring core flux gate magnetometer disclosed in Geyger U.S. Pat. No. 3,403,329. In particular, the present invention uses certain features of what is disclosed in that patent but improves upon them in such a way as to make possible a modular magnetometer capable of being manufactured and sold at a price which makes it a consumer item rather than a laboratory curiosity. Moreover, these improvements in the magnetometer provide equal or improved magnetic field sensing capabilities.

It is an object of the present invention to provide an improved ferrous metal detector.

It is another object of the present invention to provide a commercially salable magnetometer-detector.

Another object of the present invention is to provide commercially acceptable flux gate magnetometers.

It is still another object of the present invention to provide inexpensive, magnetic field detectors.

Another object of the present invention is to provide an inexpensive modular magnetometer which can be used in special customization applications.

It is another object of the present invention to provide a modular magnetometer complete with electronics in a sub-unit usable by circuit designers familiar with electronics but not with magnetics.

It is another object of the present invention to provide flux gate magnetometers which can be combined for use in gradient mode applications.

It is another object of the present invention to provide a flux gate magnetometer-detector having simple nulling as well as low power consumption.

Flux gate magnetometers having the foregoing features have unlimited capabilities and uses. Primary among their uses is as a detector of ferromagnetic materials such as ferrous metals and ferrites. As a detector they have many uses by government (including federal, state, county and municipal), industrial and commercial manufacturers. As a detector, the magnetometers can be mounted in a night stick as a gradiometer. The night stick or club having the magnetometers mounted therein can be passed in close proximity to a suspect for purpose of searching him or her without actually touching the person. A meter reading indicates the presence of a ferrous metal object needing further investigation. When used as a search device the magnetometers can be mounted also in a flashlight or a cane, or even strapped to a person's arm.

Other applications for detection of ferromagnetic objects beyond weapons detectors include antitheft examining stations, vehicular parking and traffic controls, industrial processing controls, military ordnance fuses, security surveillance systems, intruder and shoplifting alarms, and many others. Other more specific uses may include fusing and triggering missiles, mines and other munitions; safety inspection for munition sparkables and foreign matter in foods and supplies. The magnetometer can be used as a locater as in the following instances: searching for above-ground ordnance, booby traps, arm caches, geodetic survey markers, and discarded weapons; locating varied land mines, weapons, stolen goods, archeological artifacts, pipe lines, and other utilities devices; as an underwater locater for stolen goods, weapons, mines ship gear, salvage, waterway safety; and as a locater of pipes and other devices within the walls of buildings and other constructions.

The devices when properly applied can be used as magnetic "signature" recognition devices for ships, security systems, migratory birds, and fish. On the industrial level the magnetometers can be used to prevent theft of industrial products, tools and the like. For government the detectors can be used by the courts, prisons, military and legislature as a security system. Security systems are equally applicable for banks, stores, theaters and all government buildings. The devices may be used as toll verifiers for bridges, ferries, turnpikes, race tracks and drive-in theaters.

The magnetometer may further be used as a controller such as to determine the presence or absence of airplanes on airport runways, taxiways, and ramps. In a like manner traffic control is possible such as by way of highway and rail counters, safety monitors, direction changing reversible lanes, speed monitors, length monitors, counters, and actuators. The devices may also be used as controls for industrial processes by counting, and locating ferrous objects.

In the medical field the magnetometers may be appropriately used as a post-operative instrument to examine for medical instruments and shrapnel. It can be used in emergency wards to locate the presence of foreign objects made of ferrous metal.

The foregoing paragraphs describe devices using the principle of detection of the presence of and/or motion of ferromagnetic materials. This invention is also directed to devices which detect changes in the earth's magnetic field or devices which detect motion relative to the earth's field, all in the absence of ferromagnetic materials. Such devices can be used in the following manner: they are set on the object whose position should not be changed such as a pile of lumber at a building site. Should any lumber be removed, the device will necessarily shift in position. The result is a change in the position of the detector relative to its magnetic field. This change in relative position is detected and used to initiate an alarm.

From the foregoing, it should be obvious that the present invention has unlimited uses when appropriately applied at the commercial level.

For the purpose of illustrating the invention, there are shown in the drawings forms which are presently preferred; it being understood, however, that this invention is not limited to the precise arrangements and instrumentalities shown.

FIG. 1 is a perspective view of a night stick incorporating the present invention.

FIG. 2 is a schematic of the circuitry for a magnetometer.

FIG. 4 illustrates a mounting for the magnetometer.

FIG. 7 shows a mounting for a walk-through type of a gradiometer.

FIG. 8 illustrates a potential use for a pair of gradiometers constructed in accordance with the present invention.

FIG. 9 shows a block diagram for a magnetometer alarm system.

FIG. 10 shows a schematic block diagram of the circuitry for the gradiometer illustrated in FIGS. 7 and 8.

FIG. 11 shows a flashlight incorporating the concepts of the present invention.

FIG. 12 shows another method for incorporating the concepts of the present invention.

Figure 3:
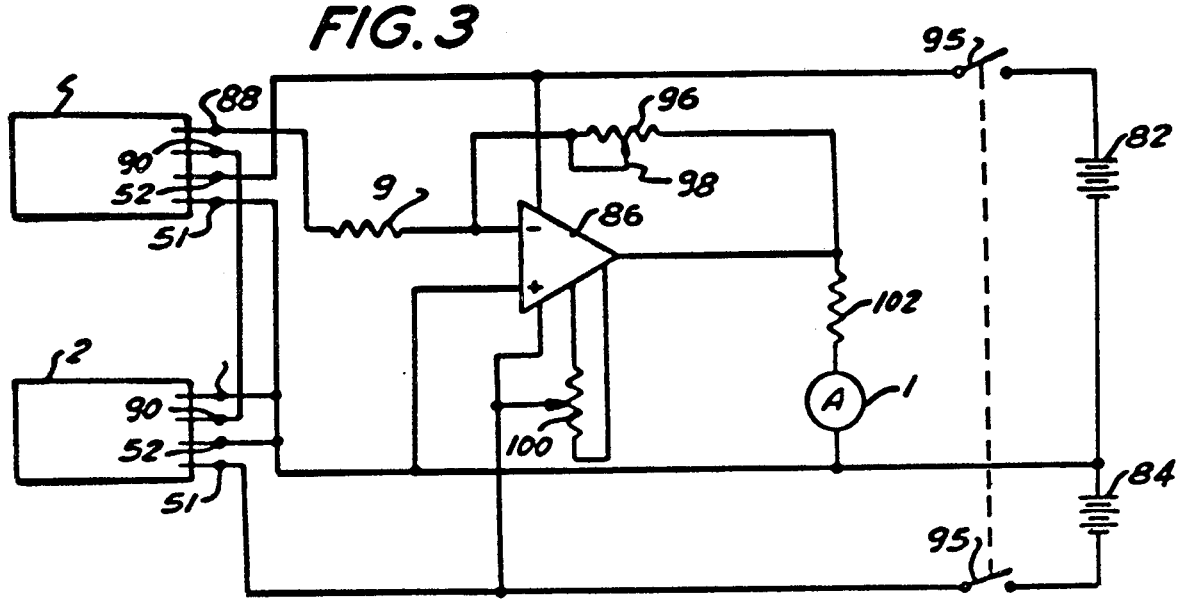
FIG. 3 is a schematic of a night stick gradiometer.

Referring now to the drawings in detail, wherein like numerals indicate like elements, there is shown in FIG. 1 a policeman's club generally known as a night stick and designated generally as 10. As shown, the night stick is of conventional size and shape (24 inches in length and 1½ inches in diameter) and includes a handle 12 within which the power supply batteries are mounted. The night stick 10 is essentially a portable, self-container battery-powered gradiometer. Its purpose is to detect ferrous metal items such as guns, knives and other weapons without the necessity for making personal contact with the suspect. To this end, two magnetic detectors (described below) are mounted at spaced positions within the night stick 10.

Outwardly, the night stick 10 looks like any other night stick with the exception that a meter 14 and controls 16 and 18 are mounted on its outside surface. The meter 14 includes a needle 20 which indicates the presence of a ferrous metal object by a sudden movement as the night stick is moved into proximity with the ferrous metal object. The control 16 comprises a knurled knob for providing on-off control and a range (sensitivity) adjustment for the meter 14. The control 18 is a knurled knob for nulling (zeroing) the meter 14.

As indicated above, two detectors forming a gradiometer are mounted within the night stick 10. These detectors are magnetometers 22. Referring now to FIGS. 2 and 4, the circuitry and structure for the magnetometer-detectors is illustrated.

In FIG. 2 there is illustrated the circuitry for a magnetometer 22 in accordance with the present invention. As shown, the magnetometer includes a core 24 made of a magnetic material that saturates at relatively low field intensities. In the preferred embodiment of the present invention, core 24 is annular in configuration. It should be understood, however, that the present invention is not limited to annular cores. Those skilled in the art will recognize that the geometric configuration of the core can take on any shape; provided, however, that the core forms an essentially closed magnetic path (that is, a path in which any air gap is of little consequence). For purposes of simplicity, cores have the foregoing characteristics will be referred to throughout this specification as "ring cores". Specifically, a core that is useful with the circuitry that is described hereinafter may have a bobbin groove diameter of .625 inches on which is spirally wound 20.0 wraps of 0.000125 inch thick by one-eighth inch wide 79–4 Permalloy. Once wound on the bobbin, the core material is annealed in accordance with the standard practice established in the magnetics industry.

The core material may be any one of a number of well known nickel alloy magnetic materials including those known as Permalloy. By way of example but not limitation, the core 24 for the magnetometer made in accordance with the present invention may be a 79–4 nickel-molbydenum-iron alloy composition. The core material is preferably tape wound on an annular, stainless steel, non-magnetic bobbin and then covered with a protective cover material such as a semi-rigid plastic sleeve. As is conventional, the core is annealed after the windings have been wound on it. This conventional practice of annealing cores after winding is discussed in the U.S.

Pat. 3,434,047 issued Mar. 18, 1969 in the name of Joseph L. Brickner.

As shown in FIG. 2, six individual windings are positioned on the core in the manner described below. Windings 26, 28, 30 and 32 may be referred to as the drive windings in that they generate the magnetic flux in conjunction with circuitry 34. The windings 36 and 38 may be referred to as detector windings in that the flux generated by the drive windings 26–32 is coupled into these windings so as to induce a voltage therein. The voltage developed across the windings 36 and 38 is connected to a detector circuit 40 described in detail below.

In the prior art, windings such as windings 26–32 are wound about an annular core in multifilar fashion; that is, the four wires used to make drive windings 26–32 are first braided together and then wound about the core. The purpose in using this approach was to achieve tight coupling of the field produced by the windings 26–32. While such an approach produces a most capable magnetometer, it has been found that it cannot be manufactured except by hand. In accordance with the present invention it has been determined that a magnetometer of equal sensitivity can be made using six discrete windings even though they do not have quite the same tight coupling. The principal advantage of using unifilar windings is that they can be wound by automatic winding machinery. Another effective means of enabling a unifilar winding is to use a sheathed multiconductor cable which may be wound in a unifilar fashion and connected in a multifilar configuration.

Figure 5:
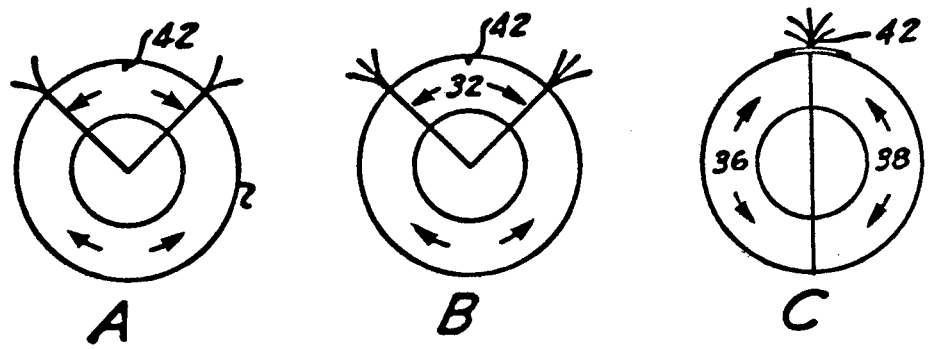
FIG. 5 illustrates the winding scheme for the coil for the magnetometer.

The method of winding the windings 26–32 and 36, 38 on the core 24 is best described by reference to FIG. 5. FIG. 5 shows the core in three stages of its manufacture. FIG. 5A shows the core with the first layer of windings placed thereon. FIG. 5B shows the core with the second layer of windings placed thereon. FIG. 5C shows the core with a third layer of winding placed thereon. The first layers of windings forms windings 26 and 28. And the third layer of windings forms windings 36 and 38.

To make the windings, the core is first marked with a line that represents 0° on a circle defined by the core 24. This marker is positioned where the tape wound alloy material begins and ends; it being understood that the tape forming the core is started and stopped at the 0° position as defined. The 0° marker is identified by the numeral 42 in FIG. 5.

Each winding is made of No. 34 enamel coated copper wire.

The particular positioning of the windings is best understood by reference to the following table:

| WINDING | LAYER | SECTOR | START | WIRE | TURNS |
|---|---|---|---|---|---|
| 18 | 1 | 240° | 60° CW | #34 | 300T |
| 28 | 1 | 120° | 60° CCW | #34 | 150T |
| 30 | 2 | 240° | 60° CW | #34 | 300T |
| 32 | 2 | 120° | 60° CCW | #34 | 150T |
| 36 | 3 | 180° | 0° | #34 | 300T |
| 38 | 3 | 180° | 0° | #34 | 300T |

The symbol CW and CCW in the above table stands for clockwise and counterclockwise, respectively. However, it is understood that winding 26 in layer 1 need not be wound in a clockwise direction in any absolute sense of the term, but only that it be wound in the opposite direction from winding 28 in layer 1. In other words, the designations CW and CCW are used to designate relative directions of winding the respective windings.

As indicated by the foregoing table, windings 26–32 are proportioned by sector and turns to have the same winding density. Note that even though they are connected in series relation in FIG. 2, they are wound and connected so as to generate opposing voltages when the same are induced by the drive windings 26–32.

Upon completion of the winding of the core 24, the core is positioned in a mounting fixture 44 as illustrated in FIG. 4. The mounting fixture 44 is preferably made of a rigid non-magnetic material and provided with a cylindrical cavity 46 and a rectangular cavity 48 as shown. Cavity 46 receives the core 24 with windings 26–32, 36 and 38 thereon as shown. The leads brought out as shown are connected to the drive circuit 34 and the detector circuit 40 mounted within the rectangular cavity 48. It should be noted that the drive circuit 34 and detector circuit 40 are mounted within the cavity in side-by-side relation so that no separation between the two circuits is needed or required. A terminal board 50 for the output of the detector and the battery supply voltage input is fixed to the end of the mounting fixture 44. Appropriate leads connect the terminals on the board to the detector 40 and drive circuit 34.

Referring again to FIG. 2, the drive circuit 34 is essentially a core-transistor inverter circuit. A voltage of approximately 6.6 volts DC is provided by a battery or similar source at the terminals 51 and 52. The negative terminal 51 is connected through resistor 54 to the emitter of each of the NPN transistors 56 and 58. The negative terminal 51 is also connected through resistor 54 to one terminal of the capacitors 60 and 62. The opposite terminal of capacitor 60 is connected to the base of transistor 56. The other terminal of capacitor 62 is connected to the base of transistor 58. The bases of transistors 56 and 58 are connected through resistors 64 and 66 to the terminals of the windings 28 and 32, respectively. The collector of transistor 56 is connected to one terminal of winding 26 and the collector of transistor 58 is connected to one terminal of winding 30. The opposite terminals of windings 26 and 30 are commonly connected to the positive terminal 52. In a like manner one terminal of each of the windings 28 and 32 are connected through resistor 68 to the positive terminal 52.

The function of the circuit 34 need not be described in detail inasmuch as its operation as an inverter circuit will be apparent to those skilled in the art. It should be sufficient to point out that the windings 26 and 30 provide the alternating flux drive within the core. Windings 28 and 32, on the other hand, being connected to the base of the transistors 56 and 58 provide the commutation for the inverter circuit 34. Capacitors 60 and 62 are connected to suppress transient oscillations created by the capacity of the windings 26–32. In appropriate circumstances they can be eliminated and open circuits substituted in their place such as where there is no effective winding capacitance or it is sufficiently small so as to have little or no effect upon the operation of the circuit. Resistor 54 permits cross connection with a common power supply, stabilizes current drain from the circuit and stabilizes performance of the inverter drive circuit 34 under varying supply voltages. Resistors 64, 66 and 68 bias the transistors 56 and 58 in the conventional manner.

As shown, detector windings 36 and 38 are connected in a series opposing relationship for the fundamental frequency. One terminal of winding 38 is connected directly to the output terminal 90. One terminal of winding 36 is connected to the inverse-parallel connected diodes 70 and 72. Capacitor 74 is connected across the output terminals 88 and 90 in parallel with resistor 76 as shown. Capacitor 74 cooperates in circuit relation with the diodes 70 and 72 to provide a voltage which is proportional to the phase relationship between the alternating current voltage generated by the drive circuit 34 and the second harmonic voltage generated across the terminals of windings 36 and 38 when the magnetometer is influenced by an external magnetic field. The other ends of windings 36 and 38 are commonly connected to capacitor 80. Capacitor 80 is connected in parallel with winding 38 as shown. Resistor 76 adjusts the output gain relationship to the external magnetic field. Capacitor 80 increases the gain of the detector circuit by a factor up to 10.

By way of example, but not limitation, the following components may be used in the construction of the circuit illustrated in FIG. 2:

| COMPONENTS: | | |
| --- | --- | --- |
| Resistors | | |
| 64, 66 | 2 | 18K ohms |
| 68 | 1 | 22K ohms |
| 76 | 2 | Selected for gain, range 100 to 1000 ohms typical. |
| 54 | 1 | 330 ohms |
| Semi-Conductor | | |
| 56, 58 | 2 | 2N 3392 |
| 70, 72 | 2 | 1N 754 |
| Capacitors | | |
| 80 | 1 | .047 $\mu$f |
| 74 | 1 | 100 $\mu$f |
| 60, 62 | 2 | 220 pf |

A magnetometer constructed in accordance with the foregoing will produce linear gain of approximately 160 millivolts at 50,000 gamma. In another high gain version, the magnetometer will produce a gain of 240 millivolts at 50,000 gamma.

Referring now to FIG. 3, there is shown a schematic diagram of an amplifier and power supply to be used in conjunction with two magnetometers 22. As connected in FIG. 3 the magnetometers 22 (see FIG. 2) form a gradiometer. This gradiometer is the embodiment of the circuitry installed in the night stick 10.

As shown in FIG. 3, direct current power is provided by batteries 82 and 84 with a double pole single throw switch 95 providing on-off control. The positive terminal of battery 82 is connected through one pole of switch 95 to terminal 52 of magnetometer 22A and to the amplifier 86. The negative terminal of battery 84 is connected through switch 95 to amplifier 86 and to terminal 51 of magnetometer 22B. The common connection between batteries 82 and 84 is connected through one terminal of meter 14, to the noninverting input of amplifier 86, to terminal 52 and 88 of magnetometer 22B and to terminal 51 of magnetometer 22A. Terminal 90 of magnetometer 22A is connected to terminal 90 of magnetometer 22B as shown. Terminal 88 of magnetometer 22A is connected in series with resistor 92 which in turn is connected to the inverting input of amplifier 86.

Amplifier 86 is an operational amplifier. With resistor 92 and potentiometer 96 connected as shown it is an inverting amplifier with a gain greater than 1. As shown, meter 14 is connected in series with resistor 102 which in turn is connected to the output of amplifier 86 as well as to potentiometer 96. The gain of amplifier 86 is controlled by adjusting potentiometer 96 whose brush 98 is mechanically coupled to the on-off switch 95 and knob 16 to adjust the range (sensitivity) of the unit. A potentiometer 100 is mechanically coupled to the null knob 18 to provide zeroing for the meter 14. Amplifier 86 may be a type 741 integrated circuit operational amplifier.

To effect operation of the circuit illustrated in FIG. 3, the following values for the components may be used:

| COMPONENTS FOR AMPLIFIER | |
| --- | --- |
| Resistors | |
| 92 | 1K Ohms |
| 96 | 0–1 Meg Ohms |
| 100 | 0–10K Ohms |
| 102 | 1.5K Ohms |

Figure 6:
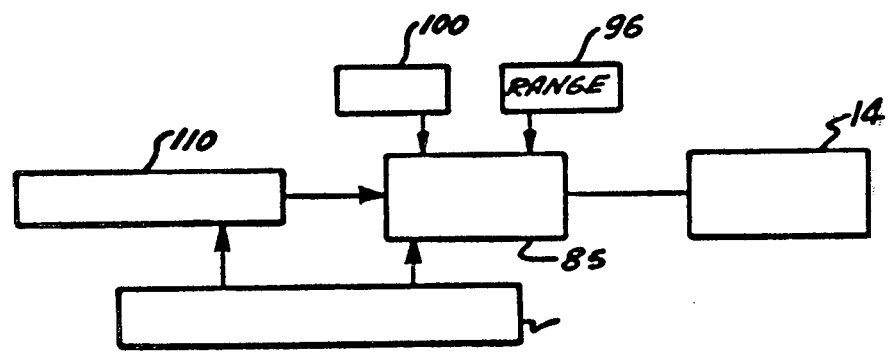
FIG. 6 is a schematic block diagram of the night stick gradiometer.

Referring now to FIG. 6, there is shown a block diagram of the circuits illustrated and described in FIGS. 2 and 3 as applied to the night stick 10 illustrated in FIG. 1. However, two magnetometers 22 as illustrated in FIGS. 2 and 4 are mounted within the night stick. Accordingly, they have been designated as gradiometer 110. The two magnetometer sensing elements are mounted 4–8 inches apart. They are connected to the amplifier circuit 85 of FIG. 6 in the manner heretofore described.

If desired, the circuitry of FIG. 6 could also be mounted in a flashlight 120 as illustrated in FIG. 11. The only difference between the flashlight 120 and the night stick 10 is that additional batteries, a lamp and reflector are provided. The switching for the flashlight can be accomplished by a rotary switch mounted on the lamp end of the flashlight 120. Preferably the flashlight is made of a strong plastic material so that it can be used as a combination flashlight and night stick.

FIG. 12 illustrates how the same circuitry of FIG. 6 can be carried on the body of a person. As shown, two magnetometers 22 are mounted within a housing 126 and are connected to the electronics and battery pouch 128. Both the magnetometers 22 within the housing 126 and the electronics and battery pouch 128 are strapped to the carrier's arm by straps 130 made of nylon or similar material.

The embodiments of the invention illustrated in FIGS. 1, 11 and 12 can be readily used by any law enforcement agency to make quick and accurate searches of suspects for hidden weapons made of ferrous metals. The officer or other law enforcement agent need only bring one end of the night stick or any other device consisting of two magnetometers within an elongated housing into proximity with the body of the person being searched. If there is any ferrous metal carried on the body of the person it will register on the meter 14 as a sudden change in position of the needle. After gaining appropriate experience the user can quickly learn to distinguish between the response produced by knives and guns and the response produced by harmless metal objects such as snaps, garter catches and watches.

FIG. 7 illustrates how the magnetometers of FIG. 2 can be used as gradiometer-detectors. In this case the circuitry of FIG. 2 as well as a mounting fixture 44 or equivalent are mounted within cylindrical housings 160 which in turn are mounted within cylindrical towers 162. These towers are provided with appropriate wall mounting brackets 164 and cable connections 166. The spacing between cartridges may be approximately 18 inches.

FIG. 8 illustrates how two of the towers 162 with magnetometers 22 within housings 160 may be mounted at the side of a passage to scan passing persons for the presence of hidden metal objects. The cable connections are connected by appropriate cabling to a monitor 170 (FIG. 10). The monitor 170 may include appropriate controls including range and null adjustments as well as an on-off switch and an optional alarm if desired. The meter within the monitor indicates the presence of ferromagnetic material in the same manner as the meter 14 on the night stick.

From the foregoing, it should be apparent how the magnetometer-detectors 22 can be used to make a gradiometer 110. As a gradiometer, the magnetometers measure the difference of the earth's magnetic field between two fixed points. For the purpose of operating detectors of the type described herein it is not necessary to know the magnitude in the earth's magnetic field; it is only necessary to sense that the field has been varied by the presence of a ferromagnetic material.

Although described with respect to night sticks, flashlights and wall mounted towers, a pair of magnetometers used as gradiometers can be mounted in an almost unlimited number of places. For example they could be mounted in hat racks, easel stands, disguised as planters, or in any other position where an elongated housing or two small magnetometer units can be mounted and/or concealed.

The magnetometers mounted within the cylindrical housings 160 which house the magnetometers vary in length from approximately 2½ to 4½ inches and have a diameter of approximately 1 inch. Thus, they are relatively small devices which can be concealed in a great number of places.

FIG. 10 shows in block form how the towers 162 illustrated in FIG. 8 can be connected to the monitor 170 to provide a sensing device for determining the presence of a ferromagnetic object on the body of a person passing between the towers. As shown, each of the towers 162 contains a pair of magnetometers 22. The output of the magnetometers 22 within each of the towers is applied to an automatic nulling apparatus 194 which removes all steady state signals. Such automatic nulling devices are conventional and therefore need not be described in detail. The output of the automatic null 194 is applied to the amplifier 85 which has a zero control 100 and range control 96 described with reference to FIG. 3. The output of the amplifier 85 may be applied to an absolute value circuit 196, which may be a conventional and well known circuit which in turn generates a signal for the comparator 198. Comparator 198 compares the output of absolute value circuit 196 with a reference value provided by circuit 200. If the comparator circuit 198 determines that the output of absolute value circuit 196 is in excess of the reference value of circuit 200, the drive circuit 202 is initiated. This circuit in turn operates an alarm which may take the form of a light 204, a sonic device 206 or a remote light 208. Power is provided to operate these circuits by a battery or line power supply 210.

The overall operation of the circuit schematically illustrated in FIG. 10 should be apparent from the description of the various elements of that circuit.

Referring now to FIG. 9, there is shown a block diagram illustrating a further use for magnetometers. As embodied in FIG. 9, the magnetometer can be used in either or both of two modes of operation. The first mode of operation is to detect the displacement of a ferromagnetic object within reasonable proximity of the magnetomer 22. The second mode of operation is to detect the physical movement of the magnetometer without reference to any ferromagnetic material. One apparent use is for a broad class of devices to protect against unauthorized intrusions, disturbances of valuables or pilferage. In other words, the apparatus illustrated in FIG. 9 will either sense the movement of a ferromagnetic object or sense that the device or its support has been moved.

With reference to FIG. 9 the foregoing is effected by connecting the output of magnetometer 22 (see FIG. 3) to an automatic null circuit 194. As indicated above, automatic null circuit 194 removes the steady state or constant signal from the output of magnetometer 22. The resulting disturbance signal is passed through the automatic null circuit 194 and applied to amplifier and trigger circuit 220 which amplifies the signal and triggers the alarm 222. The alarm 222 can be any type of well known local or remote alarm devices.

When the device of FIG. 9 is positioned in a particular location, the automatic null circuit 194 removes the effect of surrounding steady state magnetic field. Accordingly, only transient disturbances to the field are passed through to the amplifier and trigger circuit 220. Thus, the bringing of a ferromagnetic object within the range of magnetometer 22 disturbs the aforementioned magnetic field. This disturbance is sensed and used to trigger the alarm 222. In a like manner any movement of the magnetometer causes it to see a different magnetic field. This difference is coupled through the amplifier and trigger circuit 220 with a resultant energization of the alarm 222. It should also be noted that the device responds when the previously stationary ferromagnetic object within the range of magnetometer 22 is moved.

The present invention may be embodied in other specific forms without departing from the spirit or essential attributes thereof and, accordingly, reference should be made to the appended claims, rather than to the foregoing specification as indicating the scope of the invention.

We claim:

1. In an elongated hand weapon of the night stick type, a first portion of said elongated hand weapon being provided with a handle near one end and a second portion of said elongated hand weapon being adapted to be used for at least one of the functions of clubbing and prodding, said elongated hand weapon being provided with gradiometer means mounted within said elongated hand weapon for detecting the presence of ferromagnetic objects, said gradiometer means comprising a first ring core flux gate magnetometer mounted within said elongated hand weapon and a second ring core flux gate magnetometer mounted at some fixed distance from said first magnetometer within said elongated hand weapon, said first and second magnetometers having a ring core and a plurality of discrete unifilar windings on said core, and said elongated hand weapon being provided with means for indicating the presence of ferromagnetic material when one of said magnetometers is closer to said ferromagnetic material than the other of said magnetometers.

2. Apparatus for detecting ferromagnetic objects passing between a first and a second position, comprising: a first second harmonic flux gate magnetometer mounted within a first elongated structure, said first elongated structure being mounted at said first position, a second second harmonic flux gate magnetometer mounted within a second elongated structure, said second elongated structure being mounted at said second position, automatic null means for receiving the outputs of said first and second second harmonic flux gate magnetometers and being operative to produce an output signal in response to a changing input signal, absolute value circuit means receiving the output of said automatic null means and being operative to produce an output signal proportional to the magnitude of the output of said automatic null means, threshold means receiving the output of said absolute value circuit means and being operative to produce an output signal when the output of said absolute value circuit means exceeds a predetermined value, and indicator means responsive to the output signal of said threshold means for indicating when the output of said absolute value circuit means exceeds said predetermined value thereby indicating the passage of a ferromagnetic object between said first and second positions.

3. Apparatus in accordance with claim 2 wherein said indicator means is mounted at a position remote from said first and second elongated structures.

4. Apparatus in accordance with claim 2 wherein said threshold means comprises a comparator having a first and a second input and an output, said first input receiving the output signal of said absolute value circuit means and said second input receiving a signal value from a reference circuit, said comparator circuit producing an output only when said output signal from said absolute value circuit means exceeds the signal value from said reference circuit.

5. Apparatus in accordance with claim 2 wherein each of said second harmonic flux gate magnetometers is provided with an annealed ring core, a plurality of windings on said core, each winding on said core being a discrete unifilar winding.

6. Apparatus for detecting ferromagnetic objects passing between a first and second position, comprising: a first and a second second harmonic flux gate magnetometer mounted within a first elongated structure, said first and second magnetometers being mounted a predetermined distance apart within said first elongated structure and being electrically connected in opposition to form a first gradiometer, said first elongated structure being mounted at said first position, a third and a fourth second harmonic flux gate magnetometer mounted within a second elongated structure, said third and fourth magnetometers being mounted a predetermined distance apart within said second elongated structure and being electrically connected in opposition to form a second gradiometer, said second elongated structure being mounted at said second position, automatic null means for receiving the outputs of said first and second gradiometers and being operative to produce an output signal in response to a changing input signal, absolute value circuit means receiving the output of said automatic null means and being operative to produce an output signal proportional to the magnitude of the output of said automatic null means, threshold means receiving the output of said absolute value circuit means and being operative to produce an output signal when the output of said absolute value circuit means exceeds a predetermined value, and indicator means responsive to the output signal of said threshold means for indicating when the output of said absolute value circuit means exceeds said predetermined value thereby indicating the passage of a ferromagnetic object between said first and second positions 7. Apparatus in accordance with claim 6 wherein said indicator means is mounted at a position remote from said first and second elongated structures.

8. Apparatus in accordance with claim 6 wherein said threshold means comprises a comparator having a first and a second input and an output, said first input receiving the output signal of said absolute value circuit means and said second input receiving a signal value from a reference circuit, said comparator circuit producing an output only when said output signal from said absolute value circuit means exceeds the signal value from said reference circuit.

9. Apparatus in accordance with claim 6 wherein each of said second harmonic flux gate magnetometers is provided with an annealed ring core, a plurality of windings on said core, each winding on said core being a discrete unifilar winding.

* * * * *